United States Patent
Xu

(10) Patent No.: US 11,635,468 B2
(45) Date of Patent: Apr. 25, 2023

(54) METHOD, APPARATUS AND STORAGE MEDIUM FOR DETERMINING CHARGING TIME LENGTH OF BATTERY

(71) Applicant: BEIJING XIAOMI MOBILE SOFTWARE CO., LTD., Beijing (CN)

(72) Inventor: Zhenhuan Xu, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 17/465,226

(22) Filed: Sep. 2, 2021

(65) Prior Publication Data
US 2022/0276313 A1    Sep. 1, 2022

(30) Foreign Application Priority Data
Feb. 26, 2021    (CN) .......................... 202110218636.3

(51) Int. Cl.
G01R 31/3842    (2019.01)
H02J 7/00    (2006.01)

(52) U.S. Cl.
CPC ........ *G01R 31/3842* (2019.01); *H02J 7/0048* (2020.01)

(58) Field of Classification Search
None
See application file for complete search history.

(56) References Cited

U.S. PATENT DOCUMENTS

| | | | | |
|---|---|---|---|---|
| 5,926,007 A | * | 7/1999 | Okada | H02J 7/0048 |
| | | | | 320/132 |
| 2016/0209474 A1 | * | 7/2016 | Chiu | H02J 7/0048 |
| 2018/0145514 A1 | * | 5/2018 | Prabhakar | H02J 7/0071 |

FOREIGN PATENT DOCUMENTS

| | | |
|---|---|---|
| CN | 105322591 B | 8/2018 |
| CN | 106877435 B | 7/2020 |

OTHER PUBLICATIONS

European Patent Office, Extended European Search Report Issued in Application No. 21195684.2 dated Mar. 14, 2022, (8p).
Sivaranjani J et al: "Intelligent charging system for dedicated applications using lithium ion battery", 2016 Online International Conference on Green Engineering and Technology (IC-GET), IEEE, Nov. 19, 2016 (Nov. 19, 2016), (7p).

* cited by examiner

*Primary Examiner* — Jas A Sanghera
(74) *Attorney, Agent, or Firm* — Arch & Lake LLP

(57) ABSTRACT

The present disclosure relates to a method for determining a charging time length of a battery, applied to an electronic device, including: acquiring a current charging state type of the battery in response to detecting that the battery of the electronic device enters a charging state; determining a charging stage of the battery, wherein the charging stage includes a constant current charging stage and a constant voltage charging stage; and determining the charging time length required by the battery according to the charging state type and the charging stage.

15 Claims, 8 Drawing Sheets acquiring a current charging state type of the battery after it is monitored that the battery of the electronic device enters a charging state — S11 determining a charging stage of the battery, wherein the charging stage comprises a constant current charging stage and a constant voltage charging stage — S12 determining the charging time length required by the battery according to the charging state type and the charging stage — S13

METHOD, APPARATUS AND STORAGE MEDIUM FOR DETERMINING CHARGING TIME LENGTH OF BATTERY

The present application is based on and claims the priority to the Chinese Patent Application No. 2021102186363, filed on Feb. 26, 2021, the entire content of which is hereby incorporated by reference for all purposes.

TECHNICAL FIELD

The present disclosure relates to the field of battery charging, and in particular to a method, an apparatus and a storage medium for determining a charging time length of a battery.

BACKGROUND

In related technologies, with the development of electronic devices, an estimated time for battery charging time is added in more electronic devices. However, the current general estimation method is to divide the difference between the total electric quantity of the battery and the remaining electric quantity in the battery of the electronic device to be charged by the charging current, that is, $t=(Q_{max}-Q_1)/I$. This acquisition method does not consider changes in the battery charging process, and the accuracy is poor. Therefore, it is a technical problem that needs to be solved urgently to provide an accurate method for determining a charging time length of a battery of an electronic device.

SUMMARY

The present disclosure provides a method, an apparatus and a storage medium for determining a charging time length of a battery.

According to a first aspect of the present disclosure, there is provided a method for determining a charging time length of a battery, applied to an electronic device, including: acquiring, by an electronic device, a charging state type of the battery, in response to detecting that the battery of the electronic device enters a charging state; determining, by the electronic device, a charging stage of the battery, wherein the charging stage comprises a constant current charging stage and a constant voltage charging stage; and determining the charging time length required by the battery according to the charging state type and the charging stage.

According to a second aspect of the present disclosure, there is provided an apparatus for determining a charging time length of a battery, including: a processor; a memory for storing instructions executable by the processor, wherein the processor is configured to: acquire a current charging state type of the battery, in response to detecting that the battery of the electronic device enters a charging state; determine a charging stage of the battery, wherein the charging stage comprises a constant current charging stage and a constant voltage charging stage; and determine the charging time length required by the battery according to the charging state type and the charging stage.

According to a third aspect of the present disclosure, there is provided a non-transitory computer-readable storage medium, wherein when instructions in the storage medium are executed by a processor of an electronic device, the electronic device is able to execute a method for determining a charging time length of a battery, the method including: acquiring, by an electronic device, a charging state type of the battery, in response to detecting that the battery of the electronic device enters a charging state; determining, by the electronic device, a charging stage of the battery, wherein the charging stage comprises a constant current charging stage and a constant voltage charging stage; and determining the charging time length required by the battery according to the charging state type and the charging stage.

It should be noted that the above general description and the following detailed description are merely exemplary and explanatory and should not be construed as limiting of the present disclosure.

BRIEF DESCRIPTION OF THE DRAWINGS

The drawings herein are incorporated into the specification and constitute a part of the specification, show examples in accordance with the present disclosure, and are used to explain the principle of the present disclosure together with the specification.

FIG. 13 is a block diagram (general structure of an electronic device) showing an apparatus for determining the

DETAILED DESCRIPTION

Figure 1:
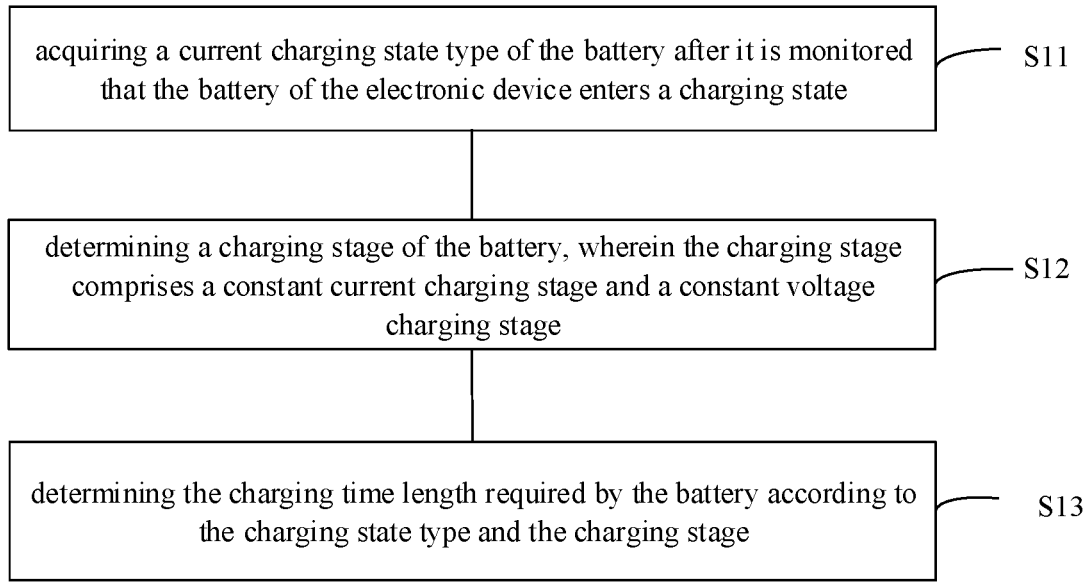
FIG. 1 is a flowchart showing a method for determining a charging time length of a battery according to one or more examples of the present disclosure.

The exemplary embodiments will be described in detail here, and examples thereof are shown in the accompanying drawings. When the following description refers to the drawings, unless otherwise indicated, the same numbers in different drawings indicate the same or similar elements. The implementation manners described in the following exemplary embodiments do not represent all implementation manners consistent with the present disclosure. On the contrary, they are merely examples of apparatuses and methods consistent with some aspects of the present disclosure as detailed in the appended claims.

Terms used in the present disclosure are merely for describing specific examples and are not intended to limit the present disclosure. The singular forms "one", "the", and "this" used in the present disclosure and the appended claims are also intended to include a multiple form, unless other meanings are clearly represented in the context. It should also be understood that the term "and/or" used in the present disclosure refers to any or all of possible combinations including one or more associated listed items.

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

It should be understood that although terms "first", "second", "third", and the like are used in the present disclosure to describe various information, the information is not limited to the terms. These terms are merely used to differentiate information of a same type. For example, without departing from the scope of the present disclosure, first information is also referred to as second information, and similarly the second information is also referred to as the first information. Depending on the context, for example, the term "if" used herein may be explained as "when" or "while", or "in response to . . . , it is determined that".

The terms "module," "sub-module," "circuit," "sub-circuit," "circuitry," "sub-circuitry," "unit," or "sub-unit" may include memory (shared, dedicated, or group) that stores code or instructions that can be executed by one or more processors. A module may include one or more circuits with or without stored code or instructions. The module or circuit may include one or more components that are directly or indirectly connected. These components may or may not be physically attached to, or located adjacent to, one another.

A unit or module may be implemented purely by software, purely by hardware, or by a combination of hardware and software. In a pure software implementation, for example, the unit or module may include functionally related code blocks or software components, that are directly or indirectly linked together, so as to perform a particular function.

The example of the present disclosure provides a method for determining a charging time length of a battery. The method for determining a charging time length of a battery is applied to electronic devices, such as mobile terminals. FIG. 1 is a flowchart showing a method for determining a charging time length of a battery according to an example of the present disclosure. As shown in FIG. 1, the method for determining a charging time length of a battery includes at least following steps:

S11, acquiring a current charging state type of the battery after it is monitored that the battery of the electronic device enters a charging state;

S12, determining a charging stage of the battery, wherein the charging stage includes a constant current charging stage and a constant voltage charging stage; and S13, determining the charging time length required by the battery according to the charging state type and the charging stage.

In the method for determining the charging time length of the battery provided by the present disclosure, a current charging state type of the battery is acquired after it is monitored that the battery of the electronic device enters a charging state, a charging stage of the battery of the electronic device is determined, and the charging time length required by the battery is determined according to the charging state type and the charging stage.

The method for determining the charging time length of the battery provided by the present disclosure can determine the charging time length required by the battery in real time according to the type of charging state and the charging stage of the battery. By distinguishing different charging scenarios, a more accurate charging time can be estimated, and the user experience is improved.

In the method for determining the charging time length of the battery provided by the present disclosure, the charging state type of the battery may include an off-screen charging state or a bright-screen charging state. The off-screen charging state is that the electronic device is in a non-power consumption state, and the screen of the electronic device is in the off-screen state. The bright-screen charging state means that the electronic device is in a power consumption state, and the electronic device is in use, for example, the smart terminal is in a call, a game, or a movie viewing state, and so on. The method for determining the charging time length of the battery provided by the present disclosure takes into account the charging state type of the battery, and determines the time length of the charging according to the scenarios of different types of charging states, thereby improving the accuracy of determining the charging time length required by the battery of the electronic device.

Figure 2:
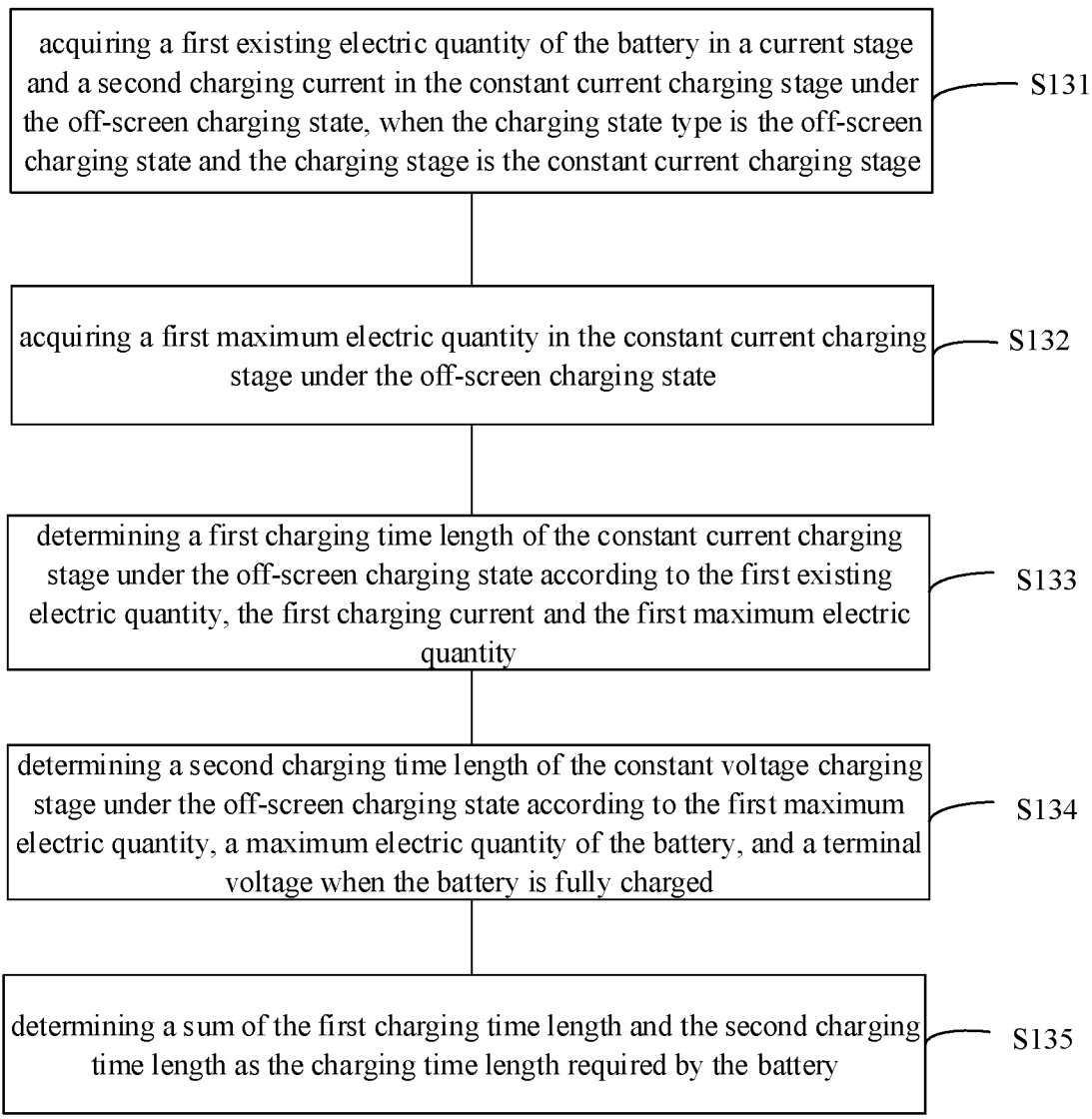
FIG. 2 shows a flowchart of a method for determining the charging time length required by the battery according to the charging state type and the charging stage of step S13 in FIG. 1.

The example of the present disclosure provides a method for determining the charging time length of the battery. As shown in FIG. 2, FIG. 2 shows a flowchart of a method for determining the charging time length required by the battery according to the charging state type and the charging stage of step S13 in FIG. 1:

S131, acquiring a first existing electric quantity of the battery in a current stage and a first charging current in the constant current charging stage under the off-screen charging state, when the charging state type is the off-screen charging state and the charging stage is the constant current charging stage;

S132, acquiring a first maximum electric quantity in the constant current charging stage under the off-screen charging state;

S133, determining a first charging time length of the constant current charging stage under the off-screen charging state according to the first existing electric quantity, the first charging current and the first maximum electric quantity;

S134, determining a second charging time length of the constant voltage charging stage under the off-screen charging state according to the first maximum electric quantity, a maximum electric quantity of the battery, and a terminal voltage when the battery is fully charged;

S135, determining a sum of the first charging time length and the second charging time length as the charging time length required by the battery.

The battery charging stage may include a constant current (CC) charging stage and a constant voltage (CV) charging stage. When the battery starts to charge, a constant current charging manner can be used. The voltage of the battery is very low at the beginning of charging. If the battery is not charged with a constant current, the charging current is very large, which will affect the battery life of the electronic device. When the electric quantity of the electronic device reaches a given level, a constant voltage charging manner can be used. The constant voltage is a terminal voltage when the battery of the electronic device is fully charged, to prevent the battery of the electronic device from being overcharged.

In the method for determining the charging time length of the battery provided by the present disclosure, when the type of the charging state is the off-screen charging state and the charging stage is in the constant current charging stage, the first charging time length of the constant current charging stage is determined first, and then the second charging time length of the constant voltage charging stage is determined. The sum of the first charging time length and the second charging time length is determined as the charging time length required by the battery.

In the off-screen charging state, when the first charging time length of the constant current charging stage is determined, according to the first existing electric quantity $Q_1$ of the battery in the current stage, the first maximum electric quantity $Q_2$ of the constant current charging stage under the off-screen charging state, and the first charging current $I_1$ of the constant current charging stage under the off-screen charging state, the first charging time length $T_1$ of the constant current charging stage under the off-screen state is determined, $T_1=(Q_2-Q_1)/I_1$. The first existing electric quantity $Q_1$ of the battery in the current stage represents the remaining electric quantity of the battery of the electronic device in the current stage.

Figure 3:
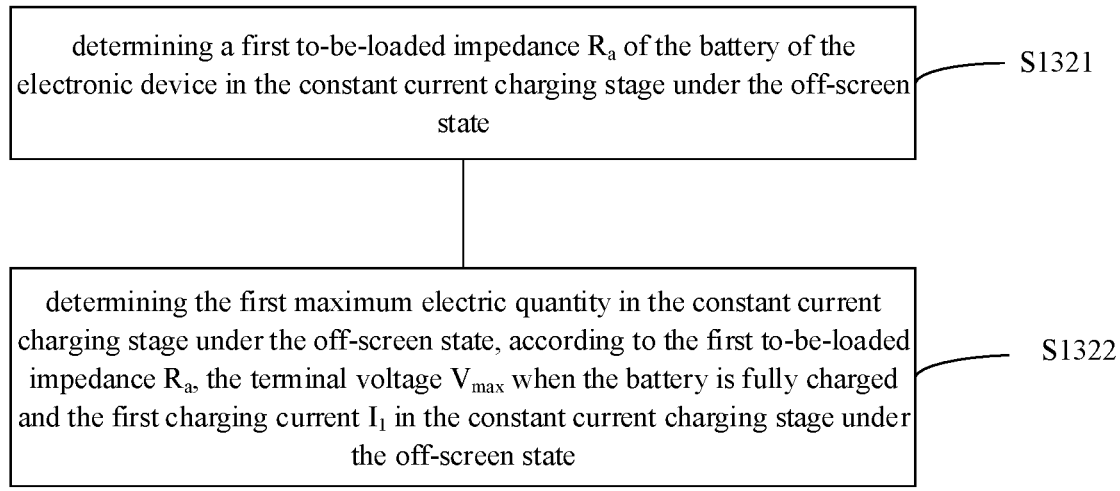
FIG. 3 shows a flowchart of a method for acquiring a first maximum electric quantity $Q_2$ in the constant current charging stage under the off-screen charging state of step S132 in FIG. 2.

The first maximum electric quantity $Q_2$ represents, in the constant-screen charging state, the electric quantity of the battery at the moment when the battery is charged from the constant current charging stage to the constant voltage charging stage under the constant-screen charging state. In the method for determining the battery charging time length provided by the present disclosure, as shown in FIG. 3, FIG. 3 shows a flowchart of a method for acquiring a first maximum electric quantity $Q_2$ in the constant current charging stage under the off-screen charging state of step S132 in FIG. 2:

S1321, determining a first to-be-loaded impedance $R_a$ of the battery of the electronic device in the constant current charging stage under the off-screen state;

S1322, determining the first maximum electric quantity in the constant current charging stage under the off-screen state, according to the first to-be-loaded impedance $R_a$, the terminal voltage $V_{max}$ when the battery is fully charged and the first charging current $I_1$ in the constant current charging stage under the off-screen state.

In the constant voltage stage under the off-screen state, the charging voltage is the terminal voltage $V_{max}$ when the battery of the electronic device is fully charged. Then, the voltage at the moment from the constant current charging stage to the constant voltage charging stage during the battery charging process is $V_{max}$. According to the OCV (Open Circuit Voltage) model, the first maximum electric quantity $Q_2$ in the constant current charging stage can be determined according to the open circuit voltage $V_{ocv2}$ at the moment from the constant current charging stage to the constant voltage charging stage during the battery charging process. The open circuit voltage $V_{ocv2}$ is equal to $V_{max}$ minus the voltage occupied by the first to-be-loaded impedance $R_a$ in the constant current charging stage under the first charging current $I_1$ of the constant current charging stage, that is, $V_{ocv2}=V_{max}-R_a*I_1$. After the open circuit voltage $V_{ocv2}$ is determined, the first maximum electric quantity $Q_2$ in the constant current charging stage under the off-screen state can be determined according to the OCV model.

Figure 4:
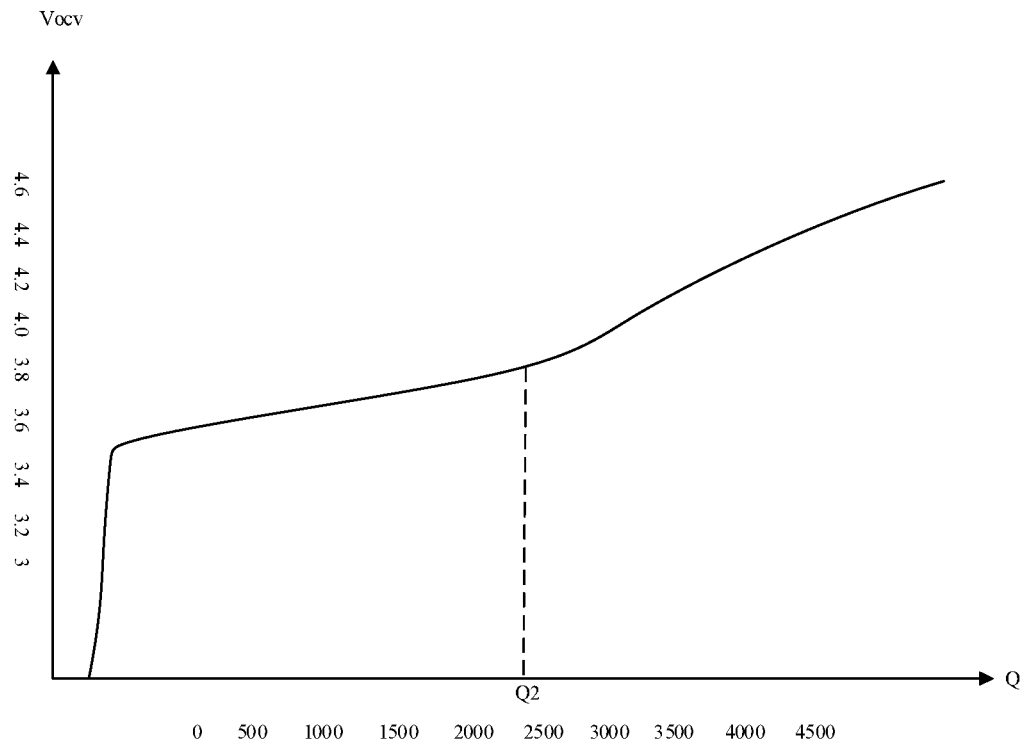
FIG. 4 illustrates a schematic diagram of the OCV curve of the OCV model.

As shown in FIG. 4, FIG. 4 illustrates a schematic diagram of the OCV curve of the OCV model. The abscissa is the capacity Q of the battery, and the ordinate is the open circuit voltage $V_{ocv}$ of the battery. After the corresponding open circuit voltage $V_{ocv2}$ is determined according to the terminal voltage $V_{max}$ when the battery of the electronic device is fully charged, the first load impedance $R_a$ in the constant current charging stage under the off-screen state, and the first charging current $I_1$ in the constant current charging stage under the off-screen state, the first maximum electric quantity $Q_2$ in the constant current charging stage under the off-screen state is determined according to the OCV curve shown in FIG. 4.

Under the off-screen charging state, after the first maximum electric quantity $Q_2$ of the constant current charging stage is determined, a first charging time length $T_1$ of the constant current charging stage under the off-screen charging state may be determined according to the first existing electric quantity $Q_1$ of the battery at the current stage, the first maximum electric quantity $Q_2$, and the first charging current $I_1$, $T_1=(Q_2-Q_1)/I_1$.

After the first charging time length $T_1$ of the constant current stage in the off-screen charging state is determined, the second charging time length $T_2$ of the constant voltage stage under the off-screen charging state is determined.

In the constant voltage charging stage under the off-screen charging state, it is necessary to determine the time required from the first maximum electric quantity $Q_2$ in the constant current charging stage under the off-screen state to the maximum electric quantity $Q_{max}$ of the battery. The second charging time length of the constant voltage charging stage under the off-screen charging state may be determined based on the first maximum electric quantity $Q_2$ in the constant current charging stage under the off-screen state and the maximum electric quantity $Q_{max}$ of the battery.

According to the OCV model, the open circuit voltage can be determined according to the fitting formula of the open circuit voltage. For example, the open circuit voltage can be determined according to the following fitting formula:

$$V_{ocv}=A_1Q^5+A_2Q^4+A_3Q^3+A_4Q^2+A_5Q+A_6=\Sigma_{n=1}^{6}A_nQ^{6-n};$$

where, Q is the electric quantity of the battery, $A_n$ is a parameter for describing the material properties of the battery, and the open circuit voltage $V_{ocv}$ is fitted with a high-order polynomial of the battery capacity Q. Its degree of fitting is larger than or equal to 0.98.

The to-be-loaded impedance R of the battery is determined according to the fitting formula of the to-be-loaded impedance of the battery. For example, the to-be-loaded impedance of the battery can be determined according to the following fitting formula:

$$R=B_1Q^5+B_2Q^4+B_3Q^3+B_4Q^2+B_5Q+B_6=\Sigma_{n=1}^{6}B_nQ^{6-n};$$

where, Q is the capacity of the battery, $B_n$ is a parameter for describing the material properties of the battery, and the to-be-loaded impedance is fitted with a high-order polynomial of the battery capacity Q. Its degree of fitting is larger than or equal to 0.98.

The second charging time length $T_2$ of the constant voltage charging stage under the off-screen charging state may be determined based on the first maximum electric quantity $Q_2$ in the constant current charging stage under the off-screen charging state, the maximum electric quantity $Q_{max}$ of the battery, and the terminal voltage when the battery is fully charged, according to the following formula:

$$T_2 = \int_{Q_2}^{Q_{max}} \frac{dQ}{dI} = \int_{Q_2}^{Q_{max}} \frac{dQ}{V_{max} - V_{ocv}} * R = \int_{Q_2}^{Q_{max}} \frac{\sum_{n=1}^{6} B_n Q^{6-n}}{V_{max} - \sum_{n=1}^{6} A_n Q^{6-n}} * dQ$$

where, T is the charging time length of the battery, $A_n$ and $B_n$ are parameters for describing the material properties of the battery, $Q_3$ is the existing electric quantity acquired at the current stage, $Q_{max}$ is the maximum electric quantity of the battery, and $V_{max}$ is the terminal voltage when the battery is fully charged.

The second charging time length $T_2$ of the constant voltage charging stage in the off-screen charging state is determined, and the sum of the first charging time length $T_1$ and the second charging time length $T_2$ is determined as the charging time length required by the battery of the electronic device.

In the method for determining the battery charging time length provided by the present disclosure, when the type of the charging state is the off-screen charging state and the charging stage is in the constant current charging stage, the first charging time length in the constant current charging stage and the second charging time length in the constant voltage charging stage under the off-screen charging state may be calculated, and the sum of the charging time lengths of the two stages is determined as the charging time length of battery charging. The method for determining the battery charging time length provided by the present disclosure fully considers the characteristics of each stage of the constant current charging stage and the constant voltage charging stage during charging the battery under the off-screen charging state, and determines the charging time length of each stage separately, and finally determines the charging time length of the battery, which improves the accuracy of the method for determining the charging time length of the battery.

Figure 5:
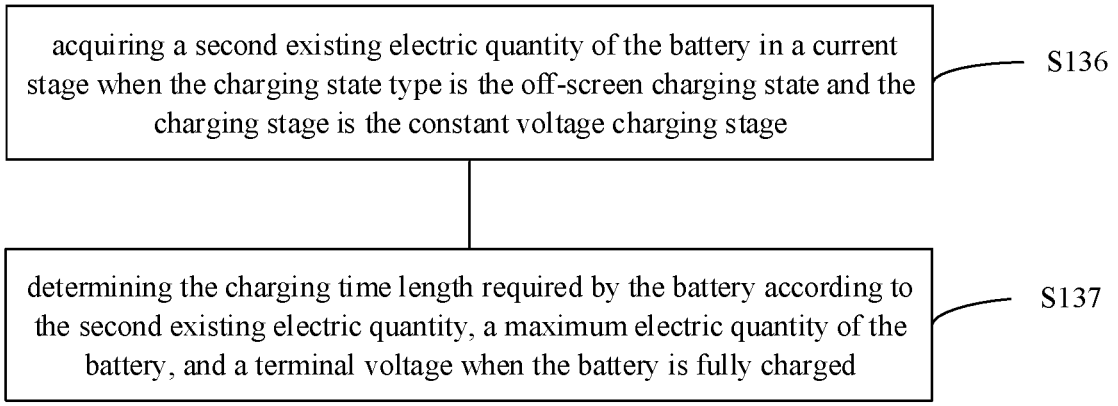
FIG. 5 shows a flowchart of a method for determining the charging time length required by the battery according to the charging state type and the charging stage of step S13 in FIG. 1.

In the method for determining the battery charging time length provided by the present disclosure, when the type of the charging state is the off-screen charging state and the charging stage is in the constant voltage charging stage, it can only consider the characteristics of the constant voltage charging stage, and only the charging time length of the constant voltage charging stage is determined as the charging time length of the battery. As shown in FIG. 5, FIG. 5 shows a flowchart of a method for determining the charging time length required by the battery according to the charging state type and the charging stage of step S13 in FIG. 1:

S136, acquiring a second existing electric quantity of the battery in a current stage when the charging state type is the off-screen charging state and the charging stage is the constant voltage charging stage;

S137, determining the charging time length required by the battery according to the second existing electric quantity, a maximum electric quantity of the battery, and a terminal voltage when the battery is fully charged.

In the method for determining the charging time length of the battery provided in the present disclosure, when the type of the charging state is the off-screen charging state and the charging stage is in the constant voltage charging stage, a second existing electric quantity $Q_3$ in the current stage when the electronic device is in the constant voltage stage under the off-screen charging state may be acquired, and the charging time length of the constant voltage charging stage under the off-screen charging state may be determined according to the second existing electric quantity $Q_3$ in the current stage and the maximum electric quantity $Q_{max}$ of the battery. The charging time length of the constant voltage charging stage under the off-screen charging state is the charging time length required by the battery.

As described above, according to the OCV model, the open circuit voltage can be determined according to the fitting formula of the open circuit voltage. For example, the open circuit voltage can be determined according to the following fitting formula:

$V_{ocv} = A_1 Q^5 + A_2 Q^4 + A_3 Q^3 + A_4 Q^2 + A_5 Q + A_6 = \sum_{n=1}^{6} A_n Q^{6-n}$;

where, Q is the electric quantity of the battery, $A_n$ is a parameter for describing the material properties of the battery, and the open circuit voltage $V_{ocv}$ is fitted with a high-order polynomial of the battery capacity Q. Its degree of fitting is larger than or equal to 0.98.

The to-be-loaded impedance R of the battery is determined according to the fitting formula of the to-be-loaded impedance of the battery. For example, the to-be-loaded impedance of the battery can be determined according to the following fitting formula:

$R = B_1 Q^5 + B_2 Q^4 + B_3 Q^3 + B_4 Q^2 + B_5 Q + B_6 = \sum_{n=1}^{6} B_n Q^{6-n}$;

where, Q is the capacity of the battery, $B_n$ is a parameter for describing the material properties of the battery, and the to-be-loaded impedance is fitted with a high-order polynomial of the battery capacity Q. Its degree of fitting is larger than or equal to 0.98.

The charging time length of the constant voltage charging stage under the off-screen charging state may be determined based on the second existing electric quantity $Q_3$ in the current state, the maximum electric quantity $Q_{max}$ of the battery, and the terminal voltage when the battery is fully charged, according to the following formula:

$$T = \int_{Q_3}^{Q_{max}} \frac{dQ}{dI} = \int_{Q_3}^{Q_{max}} \frac{dQ}{V_{max} - V_{ocv}} * R = \int_{Q_3}^{Q_{max}} \frac{\sum_{n=1}^{6} B_n Q^{6-n}}{V_{max} - \sum_{n=1}^{6} A_n Q^{6-n}} * dQ$$

where, T is the charging time length of the battery, $A_n$ and $B_n$ are parameters for describing the material properties of the battery, $Q_3$ is the existing electric quantity acquired at the current stage, $Q_{max}$ is the maximum electric quantity of the battery, and $V_{max}$ is the terminal voltage when the battery is fully charged.

In the method for determining the battery charging time length provided by the present disclosure, when the type of the charging state is the off-screen charging state and the charging stage is in the constant voltage charging stage, it can only consider the characteristics of the constant voltage charging stage, and only the charging time length of the constant voltage charging stage is determined as the charging time length of the battery, and the accuracy of the method for determining the charging time length of the battery is improved.

Figure 6:
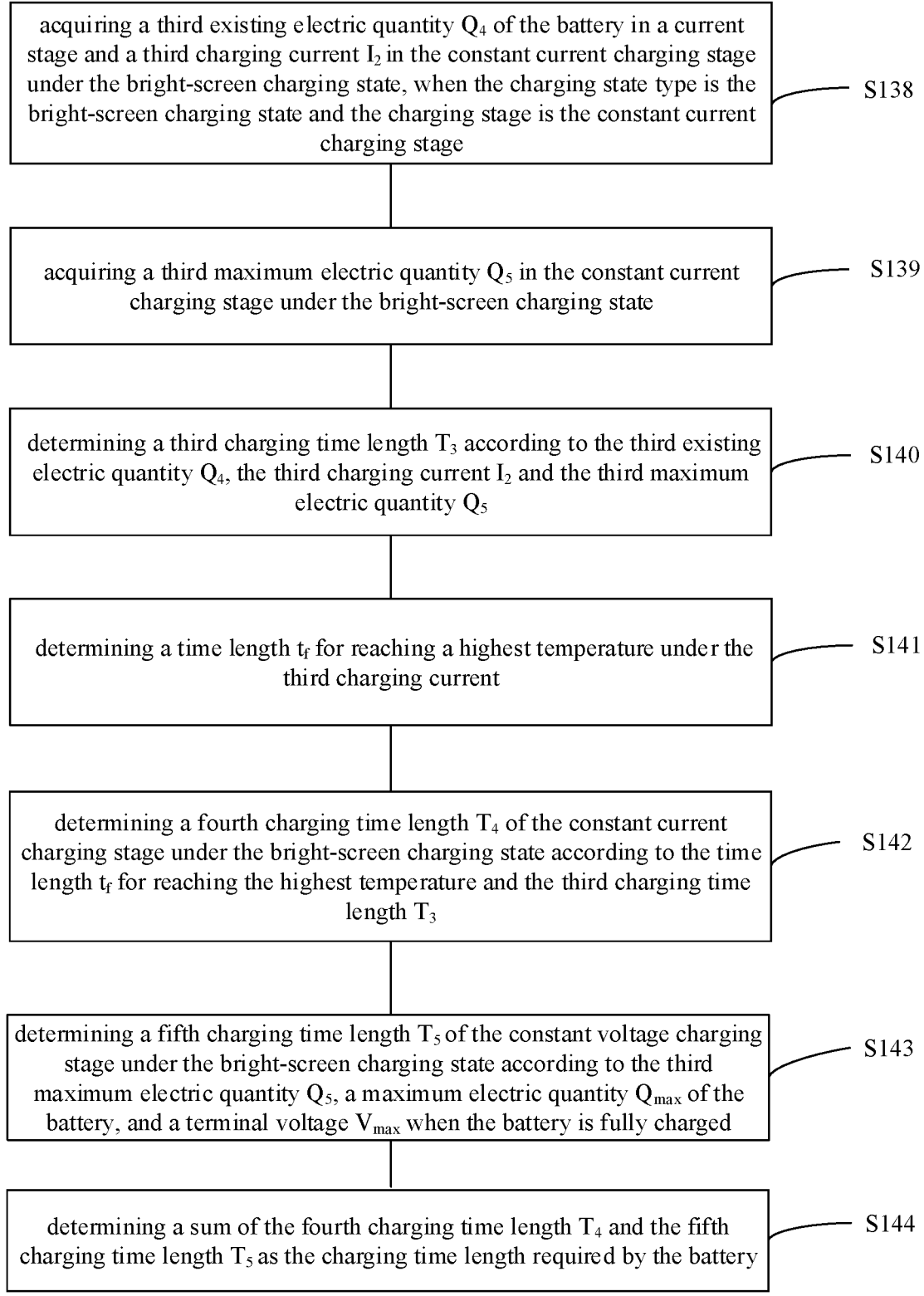
FIG. 6 shows a flowchart of a method for determining the charging time length required by the battery according to the charging state type and the charging stage of step S13 in FIG. 1.

The example of the present disclosure provides a method for determining the charging time length of a battery. As shown in FIG. 6, FIG. 6 shows a flowchart of a method for determining the charging time length required by the battery according to the charging state type and the charging stage of step S13 in FIG. 1:

S138, acquiring a third existing electric quantity $Q_4$ of the battery in a current stage and a third charging current $I_2$ in the constant current charging stage under the bright-screen charging state, when the charging state type is the bright-screen charging state and the charging stage is the constant current charging stage;

S139, acquiring a third maximum electric quantity $Q_5$ in the constant current charging stage under the bright-screen charging state;

S140, determining a third charging time length $T_3$ according to the third existing electric quantity $Q_4$, the third charging current $I_2$ and the third maximum electric quantity $Q_5$;

S141, determining a time length $t_f$ for reaching a highest temperature under the third charging current;

S142, determining a fourth charging time length $T_4$ of the constant current charging stage under the bright-screen charging state according to the time length $t_f$ for reaching the highest temperature and the third charging time length $T_3$;

S143, determining a fifth charging time length $T_5$ of the constant voltage charging stage under the bright-screen charging state according to the third maximum electric quantity $Q_5$, a maximum electric quantity $Q_{max}$ of the battery, and a terminal voltage $V_{max}$ when the battery is fully charged;

S144, determining a sum of the fourth charging time length $T_4$ and the fifth charging time length $T_5$ as the charging time length required by the battery.

In the method for determining the charging time length of the battery provided by the present disclosure, when the type of the charging state is the bright-screen charging state and the charging stage is in the constant current charging stage, the fourth charging time length of the constant current charging stage is determined first, and then the fifth charging time length of the constant voltage charging stage is determined. The sum of the fourth charging time length and the fifth charging time length is determined as the charging time length required by charging of the battery.

The third charging time length $T_3$ is determined according to the third existing electric quantity $Q_4$, the third maximum electric quantity $Q_5$, and the third charging current $I_2$, $T_3=(Q_5-Q_4)/I_2$. The third existing electric quantity $Q_4$ in the current stage of the battery represents the remaining electric quantity in the current stage of the battery of the electronic device. The third maximum electric quantity $Q_5$ of the constant current charging stage in the bright-screen charging state represents the electric quantity of the battery at the moment from the constant current charging stage to the constant voltage charging stage during the battery charging process under the bright-screen charging state.

Figure 7:
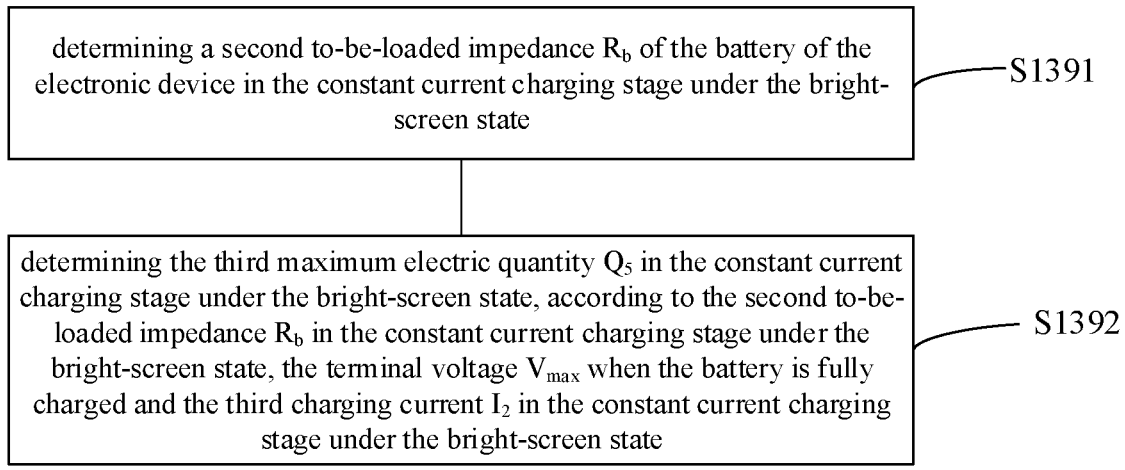
FIG. 7 shows a flowchart of the method for acquiring a third maximum electric quantity $Q_5$ in the constant current charging stage under the bright-screen charging state of step S139 in FIG. 6.

To obtain the third maximum electric quantity $Q_5$, reference may be made to the method of obtaining the first maximum electric quantity $Q_2$ in the constant current charging stage in the off-screen charging state given in FIG. 3 above. As shown in FIG. 7, FIG. 7 shows a flowchart of the method for acquiring a third maximum electric quantity $Q_5$ in the constant current charging stage under the bright-screen charging state of step S139 in FIG. 6:

S1391, determining a second to-be-loaded impedance $R_b$ of the battery of the electronic device in the constant current charging stage under the bright-screen state;

S1392, determining the third maximum electric quantity $Q_5$ in the constant current charging stage under the bright-screen state, according to the second to-be-loaded impedance $R_b$ in the constant current charging stage under the bright-screen state, the terminal voltage $V_{max}$ when the battery is fully charged and the third charging current $I_2$ in the constant current charging stage under the bright-screen state.

In the constant voltage stage under the bright-screen state, the charging voltage is the terminal voltage $V_{max}$ when the battery of the electronic device is fully charged. Then, the voltage at the moment from the constant current charging stage to the constant voltage charging stage during the battery charging is $V_{max}$. According to the OCV model, the third maximum electric quantity $Q_5$ in the constant current charging stage under the bright-screen state can be determined according to the open circuit voltage $V_{ocv5}$ at the moment from the constant current charging stage to the constant voltage charging stage during the battery charging process. The open circuit voltage $V_{ocv5}$ is equal to $V_{max}$ minus the voltage occupied by the second to-be-loaded impedance $R_b$ in the constant current charging stage in the bright-screen state under the third charging current $I_3$ of the constant current charging stage, that is, $V_{ocv5}=V_{max}-R_b*I_2$. After the open circuit voltage $V_{ocv5}$ is determined, the third maximum electric quantity $Q_5$ in the constant current charging stage can be determined according to the OCV model.

Figure 8:
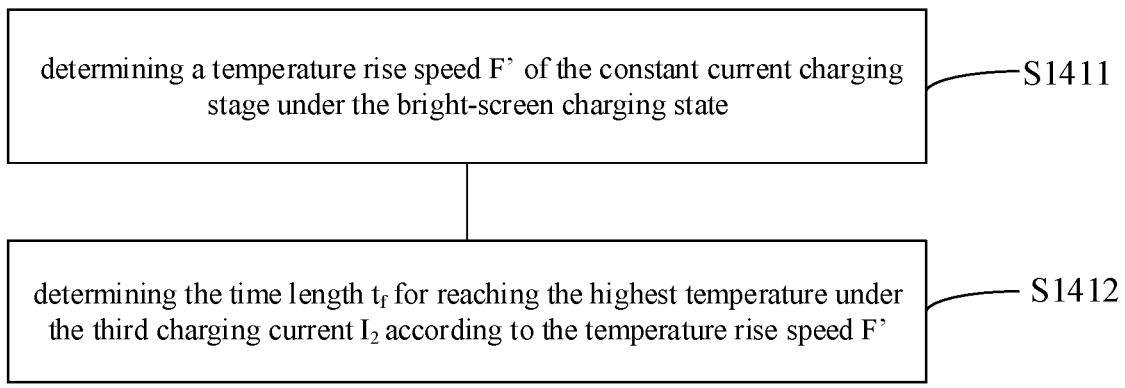
FIG. 8 shows a flowchart of the method for determining a time length $t_f$ for reaching a highest temperature under the third charging current of the constant current charging stage under the bright-screen charging state.

A time length $t_f$ for reaching a highest temperature under the third charging current $I_2$ of the constant current charging stage in the bright-screen charging state is determined. In the method for determining the battery charging time length provided by the present disclosure, as shown in FIG. 8, FIG. 8 shows a flowchart of the method for determining a time length $t_f$ for reaching a highest temperature under the third charging current $I_2$ of the constant current charging stage under the bright-screen charging state:

S1411, determining a temperature rise speed F' of the constant current charging stage under the bright-screen charging state;

S1412, determining the time length $t_f$ for reaching the highest temperature under the third charging current $I_2$ according to the temperature rise speed F'.

In the bright-screen charging state, for example, in a scene where the mobile terminal is in a game, watching a movie or in a call, because the electronic device is in a power consumption state, when it is in the constant current charging stage, since the charging current is relatively large, it needs to consider that the power consumption of the electronic device causes the temperature of the electronic device to change to affect the charging time length of the battery of the electronic device. In the method for determining the battery charging time length provided by the present disclosure, the time length $t_f$ for reaching the highest temperature under the charging current of the constant current charging stage in the bright-screen charging state is determined according to the temperature rise speed of the constant current charging stage under the bright-screen charging state.

Figure 9:
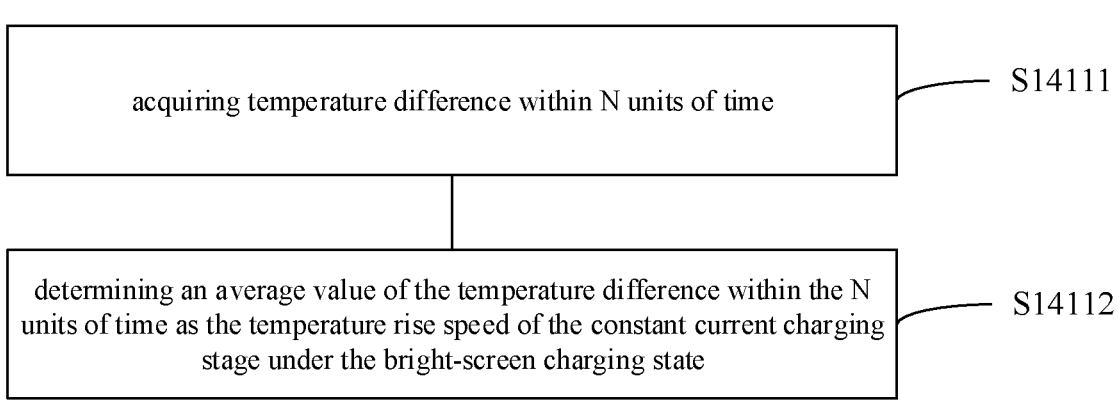
FIG. 9 shows a flowchart of the method for determining a temperature rise speed F' of the constant current charging stage under the bright-screen charging state of step S1411 in FIG. 8.

The temperature rise speed F' of the constant current charging stage under the bright-screen charging state may be determined in any determinable manner, for example, it may be determined in the following manner. As shown in FIG. 9, FIG. 9 shows a flowchart of the method for determining a temperature rise speed F' of the constant current charging stage under the bright-screen charging state of step S1411 in FIG. 8:

S14111, acquiring temperature difference within N units of time;

S14112, determining an average value of the temperature difference within the N units of time as the temperature rise speed F' of the constant current charging stage under the bright-screen charging state.

The temperature difference between the two endpoint temperatures in a unit time is the temperature rise speed in the unit time. For example, the temperature values of the two endpoints in 1 second are read and the difference between the two temperature values is calculated to obtain the temperature rise speed in 1 second. The temperature difference within N units of time can be obtained, and the average value of the temperature difference within the N units of time is determined as the temperature rise speed F' in the constant current charging stage under the bright-screen charging state. The N units of time may be continuous or discontinuous N units of time. For example, N units of time may be obtained according to equal interval time length, which is not limited herein.

After the temperature rise speed is determined, the time length $t_f$ for reaching the highest temperature under the third charging current can be determined according to the determined temperature rise speed F'. For example, the time length $t_f$ for reaching the highest temperature can be determined as follows.

The ratio of the difference value of the highest temperature $F_{max}$ reached by the electronic device under the third charging current to the temperature $F_1$ of the electronic device at the current stage, to the temperature rise speed F' is served as the time length $t_f$ for reaching the highest temperature, that is, $t_f=(F_{max}-F_1)/F'$.

Figure 10:
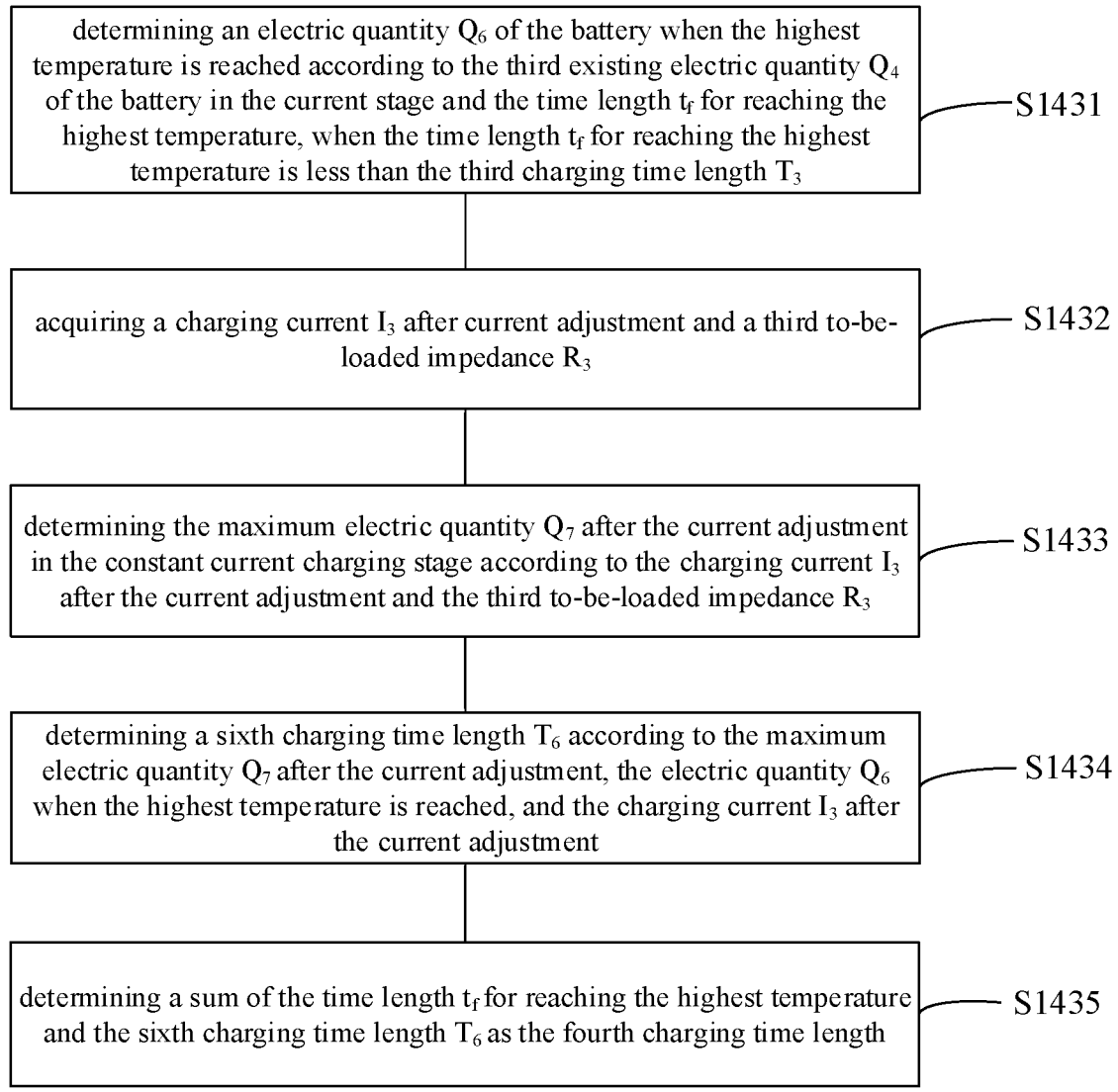
FIG. 10 shows a flowchart of a method for determining a fourth charging time length of the constant current charging stage under the bright-screen charging state according to the time length for reaching the highest temperature and the third charging time length of step S142 in FIG. 6.

A fourth charging time length of the constant current charging stage under the bright-screen charging state is determined according to the time length $t_f$ for reaching the highest temperature and the third charging time length. As shown in FIG. 10, FIG. 10 shows a flowchart of a method for determining a fourth charging time length of the constant current charging stage under the bright-screen charging state according to the time length for reaching the highest temperature and the third charging time length of step S142 in FIG. 6:

S1431, determining an electric quantity $Q_6$ of the battery when the highest temperature is reached according to the third existing electric quantity $Q_4$ of the battery in the current stage and the time length $t_f$ for reaching the highest temperature, when the time length $t_f$ for reaching the highest temperature is less than the third charging time length $T_3$;

S1432, acquiring a charging current $I_3$ after current adjustment and a third to-be-loaded impedance $R_3$;

S1433, determining the maximum electric quantity $Q_7$ after the current adjustment in the constant current charging stage according to the charging current $I_3$ after the current adjustment and the third to-be-loaded impedance $R_3$;

S1434, determining a sixth charging time length $T_6$ according to the maximum electric quantity $Q_7$ after the current adjustment, the electric quantity $Q_6$ of the battery when the highest temperature is reached, and the charging current $I_3$ after the current adjustment;

S1435, determining a sum of the time length $t_f$ for reaching the highest temperature and the sixth charging time length $T_6$ as the fourth charging time length.

In the method for determining the charging time length of the battery provided in the present disclosure, if the time length $t_f$ for the battery reaching the highest temperature is less than the third charging time length $T_3$, it means that in the constant current charging stage under the bright-screen charging state, under the third charging current, after the charging time length $t_f$, the battery of the electronic device reaches the highest temperature of the battery. The electric quantity $Q_6$ when the battery reaches the highest temperature is the sum of the third existing electric quantity $Q_4$ in the current stage of the battery, and the product of the third charging current $I_2$ of the constant current charging stage and the time length $t_f$ for reaching the highest temperature:

$$Q_6=t_f*I_2+Q_4.$$

After the battery of the electronic device reaches the highest temperature of the battery, the temperature control mechanism is triggered. After the temperature control mechanism is triggered, the charging current of the battery is lowered and adjusted to the charging current $I_3$ after the current adjustment. According to the charging current $I_3$ after the current adjustment and the third to-be-loaded impedance $R_3$ under the charging current $I_3$ after the current adjustment, the maximum electric quantity $Q_7$ after the current adjustment in the constant current charging stage can be determined, the open circuit voltage $V_{ocv3}$ under the charging current $I_3$ after the current adjustment equals to $V_{max}-R_3*I_3$, that is, $V_{ocv3}=V_{max}-R_3*I_3$. According to the OCV curve of the OCV model, the electric quantity corresponding to the open circuit voltage $V_{ocv3}$, i.e., the maximum electric quantity $Q_7$ after the current adjustment in the constant current charging stage, is obtained.

According to the maximum electric quantity $Q_7$ after the current adjustment in the constant current charging stage under the bright-screen charging state, the electric quantity $Q_6$ when the highest temperature is reached, and the charging time length after the current adjustment, the sixth charging time length $T_6$ is determined:

$$T_6=(Q_7-Q_6)/I_3.$$

In a scenario where the time length $t_f$ for reaching the highest temperature is less than the third charging time $T_3$, the charging time length of the electronic device of the constant current charging stage under the bright-screen charging state will be a sum of the time length $t_f$ for reaching the highest temperature and the sixth charging time length $T_6$, and determined as the fourth charging time length $T_4$.

In the method for determining the battery charging time length provided by the present disclosure, when the time length $t_f$ for reaching the highest temperature is greater than the third charging time length $T_3$, it means that during the constant current charging stage in the bright-screen charging state, the temperature of the battery of the electronic device will not heat up to the highest temperature of the battery and will not trigger the stability control mechanism. At this time, the charging time length of the electronic device of the constant current charging stage under the bright-screen charging state is the third charging time length $T_3$, that is, the fourth charging time length $T_4$ is the third charging time length $T_3$.

After the charging time length of the electronic device of the constant current charging stage in the bright-screen charging state is determined, the fifth charging time length $T_5$ of the constant voltage stage is determined.

When the electronic device is in the constant voltage charging stage under the bright-screen charging state, it is necessary to determine the time required from the maximum electric quantity in the constant current charging stage to the maximum electric quantity $Q_{max}$ of the battery. When the electronic device is in the constant voltage charging stage under the bright-screen charging state, since the current is gradually reduced, the temperature control mechanism will not be triggered, so the effect of temperature on the charging time length can be ignored. The fifth charging time length of the constant voltage charging stage in the bright-screen charging state can be determined according to the maximum electric quantity of the constant current charging stage in the bright-screen charging state and the maximum electric quantity $Q_{max}$ of the battery. In the scenario where the time length $t_f$ for reaching the highest temperature is greater than the third charging time length $T_3$, the maximum electric quantity in the constant current charging stage in the bright-screen charging state is $Q_5$. When the time length $t_f$ for reaching the highest temperature is less than the third charging time length $T_3$, the maximum electric quantity in the constant current charging stage under the bright-screen charging state is the maximum electric quantity $Q_7$ after the current adjustment of the electronic device in the constant current charging stage under the bright-screen charging state.

According to the OCV model, the open circuit voltage can be determined according to the fitting formula of the open circuit voltage. For example, the open circuit voltage can be determined according to the following fitting formula:

$$V_{ocv} = A_1 Q^5 + A_2 Q^4 + A_3 Q^3 + A_4 Q^2 + A_5 Q + A_6 = \Sigma_{n=1}^{6} A_n Q^{6-n};$$

where, Q is the electric quantity of the battery, $A_n$ is a parameter for describing the material properties of the battery, and the open circuit voltage $V_{ocv}$ is fitted with a high-order polynomial of the battery capacity Q. Its degree of fitting is larger than or equal to 0.98.

The to-be-loaded impedance R of the battery is determined according to the fitting formula of the to-be-loaded impedance of the battery. For example, the to-be-loaded impedance of the battery can be determined according to the following fitting formula:

$$R = B_1 Q^5 + B_2 Q^4 + B_3 Q^3 + B_4 Q^2 + B_5 Q + B_6 = \Sigma_{n=1}^{6} B_n Q^{6-n};$$

where, Q is the capacity of the battery, $B_n$ is a parameter for describing the material properties of the battery, and the to-be-loaded impedance is fitted with a high-order polynomial of the battery capacity Q. Its degree of fitting is larger than or equal to 0.98.

In the scenario where the time length $t_f$ for reaching the highest temperature is greater than the third charging time length $T_3$, the maximum electric quantity in the constant current charging stage under the bright-screen charging state is $Q_5$, the fifth charging time length $T_5$ of the electronic device in the constant voltage stage under the bright-screen charging state can be determined as follows:

$$T_5 = \int_{Q_5}^{Q_{max}} \frac{dQ}{dI} = \int_{Q_5}^{Q_{max}} \frac{dQ}{V_{max} - V_{ocv}} * R = \int_{Q_5}^{Q_{max}} \frac{\sum_{n=1}^{6} B_n Q^{6-n}}{V_{max} - \sum_{n=1}^{6} A_n Q^{6-n}} * dQ$$

where, $T_5$ is the fifth charging time length in the constant voltage stage under the bright-screen charging state, $A_n$ and $B_n$ are parameters for describing the material properties of the battery, $Q_5$ is the maximum electric quantity of the electronic device in the constant current charging stage under the bright-screen charging state, $Q_{max}$ is the maximum electric quantity of the battery, and $V_{max}$ is the terminal voltage when the battery is fully charged.

In the scenario where the time length $t_f$ for reaching the highest temperature is less than the third charging time length $T_3$, the maximum electric quantity in the constant current charging stage is the maximum electric quantity $Q_7$ of the electronic device in the constant current charging stage under the bright-screen charging state, the fifth charging time length $T_5$ of the electronic device in the constant voltage stage under the bright-screen charging state can be determined as follows:

$$T_5 = \int_{Q_7}^{Q_{max}} \frac{dQ}{dI} = \int_{Q_7}^{Q_{max}} \frac{dQ}{V_{max} - V_{ocv}} * R = \int_{Q_7}^{Q_{max}} \frac{\sum_{n=1}^{6} B_n Q^{6-n}}{V_{max} - \sum_{n=1}^{6} A_n Q^{6-n}} * dQ$$

where, $T_5$ is the fifth charging time length of the constant voltage stage in the bright-screen charging state, $A_n$ and $B_n$ are parameters for describing the material properties of the battery, $Q_7$ is the maximum electric quantity of the electronic device in the constant current charging stage under the bright-screen charging state, $Q_{max}$ is the maximum electric quantity of the battery, and $V_{max}$ is the terminal voltage when the battery is fully charged.

The fifth charging time length $T_5$ of the electronic device in the constant voltage stage under the bright-screen charging state is determined, and the sum of the fourth charging time length $T_4$ of the electronic device in the constant current charging stage under the bright-screen charging state and the fifth charging time length $T_5$ of the electronic device in the constant voltage stage under the bright-screen charging state is determined as the charging time length of the battery.

In the method for determining the charging time length of the battery provided by the present disclosure, when the charging state type is the bright-screen charging state and the charging stage is in the constant current charging stage, under the bright-screen charging state, the influence of the power consumption of the electronic device on the temperature of the electronic device and the influence of the temperature of the electronic device on the charging time length of the battery of the electronic device are considered. According to the influence of temperature, a method for determining the charging time length of the battery is provided, which improves the accuracy of the method for determining the charging time length of the battery.

Figure 11:
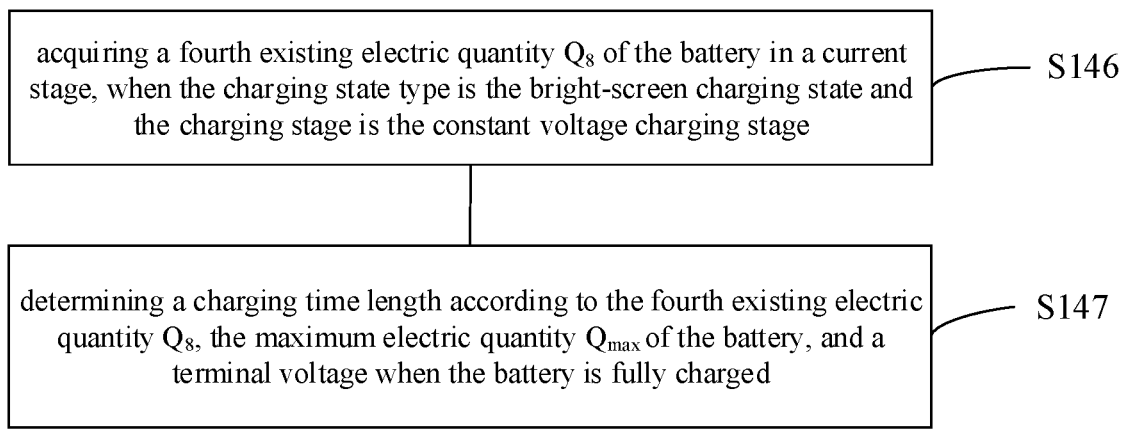
FIG. 11 shows a flowchart of a method for determining the charging time length required by the battery according to the charging state type and the charging stage of step S13 in FIG. 1.

In the method for determining the battery charging time length provided by the present disclosure, when the type of the charging state is the bright-screen charging state and the charging stage is in the constant voltage charging stage, it can only consider the characteristics of the constant voltage charging stage, and only the charging time length of the constant voltage charging stage is determined as the charging time length of the battery. As shown in FIG. 11, FIG. 11 shows a flowchart of a method for determining the charging time length required by the battery according to the charging state type and the charging stage of step S13 in FIG. 1:

S146, acquiring a fourth existing electric quantity $Q_8$ of the battery in a current stage, when the charging state type is the bright-screen charging state and the charging stage is the constant voltage charging stage;

S147, determining a charging time length according to the fourth existing electric quantity $Q_8$, the maximum electric quantity $Q_{max}$ of the battery, and a terminal voltage when the battery is fully charged.

In the method for determining the battery charging time length provided by the present disclosure, when the type of the charging state is the bright-screen charging state and the charging stage is in the constant voltage charging stage, although the electronic device is in the power consumption state under the bright-screen state, the current is gradually reduced in the constant voltage charging stage, and the temperature control mechanism will not be triggered, and the effect of temperature on the charging time length can be ignored. Therefore, in the bright-screen charging state and in the constant voltage charging stage, the fourth existing electric quantity $Q_8$ at the current stage of the electronic device in the constant voltage stage under the bright-screen charging state can be obtained, and the charging time length of the constant voltage charging stage is determined according to the fourth existing electric quantity $Q_8$ at the current stage, the maximum electric quantity $Q_{max}$ of the battery and the terminal voltage when the battery is fully charged. The charging time length of the constant voltage charging stage is the charging time length of the battery.

As described above, according to the OCV model, the open circuit voltage can be determined according to the fitting formula of the open circuit voltage. For example, the open circuit voltage can be determined according to the following fitting formula:

$$V_{ocv} = A_1 Q^5 + A_2 Q^4 + A_3 Q^3 + A_4 Q^2 + A_5 Q + A_6 = \sum_{n=1}^{6} A_n Q^{6-n};$$

where, Q is the electric quantity of the battery, $A_n$ is a parameter for describing the material properties of the battery, and the open circuit voltage $V_{ocv}$ is fitted with a high-order polynomial of the battery capacity Q. Its degree of fitting is larger than or equal to 0.98.

The to-be-loaded impedance R of the battery is determined according to the fitting formula of the to-be-loaded impedance of the battery. For example, the to-be-loaded impedance of the battery can be determined according to the following fitting formula:

$$R = B_1 Q^5 + B_2 Q^4 + B_3 Q^3 + B_4 Q^2 + B_5 Q + B_6 = \sum_{n=1}^{6} B_n Q^{6-n};$$

where, Q is the capacity of the battery, $B_n$ is a parameter for describing the material properties of the battery, and the to-be-loaded impedance is fitted with a high-order polynomial of the battery capacity Q. Its degree of fitting is larger than or equal to 0.98.

In the constant voltage charging stage under the bright-screen state, according to the obtained fourth existing electric quantity $Q_8$ in the current stage and the maximum electric quantity $Q_{max}$ of the battery, the charging time length in the constant voltage charging stage under the bright-screen state is determined, that is, the charging time length T of the battery can be determined as follows:

$$T = \int_{Q_8}^{Q_{max}} \frac{dQ}{dI} = \int_{Q_8}^{Q_{max}} \frac{dQ}{V_{max} - V_{ocv}} * R = \int_{Q_8}^{Q_{max}} \frac{\sum_{n=1}^{6} B_n Q^{6-n}}{V_{max} - \sum_{n=1}^{6} A_n Q^{6-n}} * dQ$$

where, T is the charging time length, $A_n$ and $B_n$ are parameters for describing the material properties of the battery, $Q_8$ is the obtained fourth existing electric quantity in the current stage, $Q_{max}$ is the maximum electric quantity of the battery, and $V_{max}$ is the terminal voltage when the battery is fully charged.

In the method for determining the battery charging time length provided by the present disclosure, when the type of the charging state is the bright-screen charging state and the charging stage is in the constant voltage charging stage, it can only consider the characteristics of the constant voltage charging stage, and only the charging time length of the constant voltage charging stage is determined as the charging time length of the battery, and the accuracy of the method for determining the charging time length of the battery is improved.

Figure 12:
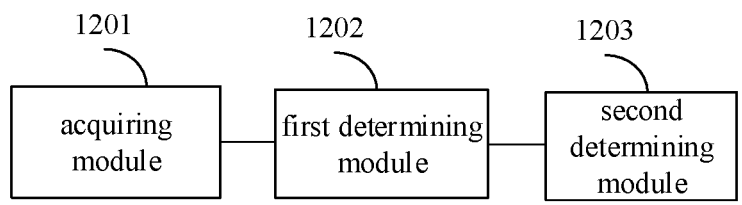
FIG. 12 is a block diagram showing an apparatus for determining the charging time length of the battery according to one or more examples of the present disclosure.

In an example of the present disclosure, an apparatus for determining a charging time length of a battery is provided. As shown in FIG. 12, FIG. 12 is a block diagram showing an apparatus for determining the charging time length of the battery according to an example of the present disclosure. Referring to FIG. 12, the determining apparatus includes an acquiring module 1201, a first determining module 1202, and a second determining module 1203.

The acquiring module 1201 is configured to acquire a current charging state type of the battery after it is monitored that the battery of the electronic device enters a charging state.

The first determining module 1202 is configured to determine a charging stage of the battery, wherein the charging stage includes a constant current charging stage and a constant voltage charging stage.

The second determining module 1203 is configured to determine the charging time length required by the battery according to the charging state type and the charging stage.

Regarding the apparatus in the above example, the specific manner in which each module performs operations has been described in detail in the example of the method, and will not be described in detail herein.

Figure 13:
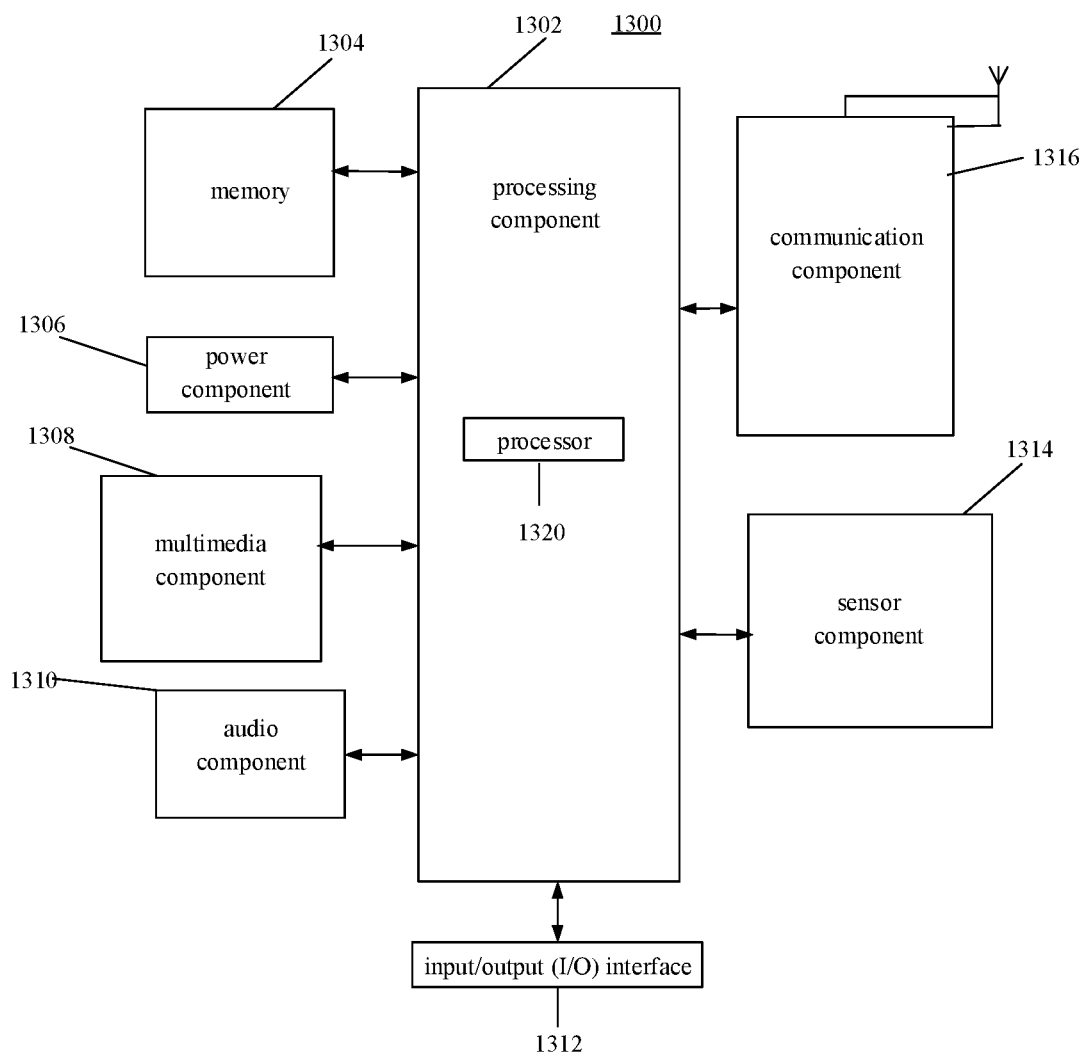

FIG. 13 is a block diagram showing an apparatus 1300 for determining the charging time length of the battery according to an example of the present disclosure. For example, the apparatus 1300 can be a mobile phone, a computer, a digital broadcast terminal, a messaging apparatus, a game console, a tablet apparatus, a medical apparatus, a fitness apparatus, a personal digital assistant, and the like.

Referring to FIG. 13, the apparatus 1300 may include one or more of the following components: a processing component 1302, a memory 1304, a power component 1306, a multimedia component 1308, an audio component 1310, an input/output (I/O) interface 1312, a sensor component 1314, and a communication component 1316.

The processing component 1302 typically controls overall operations of the apparatus 1300, such as the operations associated with display, phone call, data communications, camera operations, and recording operations. The processing component 1302 may include one or more processors 1320 to execute instructions, to perform all or part of the steps of the above method. Moreover, the processing component 1302 may include one or more modules which facilitate the interaction between the processing component 1302 and other components. For instance, the processing component 1302 may include a multimedia module to facilitate the interaction between the multimedia component 1308 and the processing component 1302.

The memory 1304 is configured to store various types of data to support the operation of the apparatus 1300.

Examples of such data include instructions for any applications or methods operated on the apparatus 1300, contact data, telephone directory data, messages, pictures, video, etc. The memory 1304 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 1306 provides power to various components of the apparatus 1300. The power component 1306 may include a power management system, one or more power sources, and any other components associated with the generation, management, and distribution of power in the apparatus 1300.

The multimedia component 1308 includes a screen providing an output interface between the apparatus 1300 and the user. In some examples, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some examples, the multimedia component 1308 includes a front camera and/or a rear camera. When the apparatus 1300 is in an operation mode, such as a shooting mode or a video mode, the front camera and/or the rear camera can receive external multimedia data. Each front and rear camera can be a fixed optical lens system or have focal length and optical zoom capability.

The audio component 1310 is configured to output and/or input audio signals. For example, the audio component 1310 includes a microphone ("MIC") configured to receive an external audio signal when the apparatus 1300 is in an operation mode, such as a call mode, a recording mode, and a voice recognition mode. The received audio signal may be further stored in the memory 1304 or transmitted via the communication component 1316. In some examples, the audio component 1310 further includes a speaker to output audio signals.

The I/O interface 1312 provides an interface between the processing component 1302 and peripheral interface modules, such as a keyboard, a click wheel, buttons, and the like. These buttons may include, but are not limited to, a home button, a volume button, a start button, and a lock button.

The sensor component 1314 includes one or more sensors to provide status assessments of various aspects of the apparatus 1300. For instance, the sensor component 1314 may detect an on/off status of the apparatus 1300, relative positioning of components, e.g., the display and the keypad, of the apparatus 1300, a change in position of the apparatus 1300 or a component of the apparatus 1300, a presence or absence of user contact with the apparatus 1300, an orientation or an acceleration/deceleration of the apparatus 1300, and a change in temperature of the apparatus 1300. The sensor component 1314 may include a proximity sensor configured to detect the presence of nearby objects without any physical contact. The sensor component 1314 may also include a light sensor, such as a CMOS or CCD image sensor, for use in imaging applications. In some examples, the sensor component 1314 may also include an accelerometer sensor, a gyroscope sensor, a magnetic sensor, a pressure sensor, or a temperature sensor.

The communication component 1316 is configured to facilitate communication, wired or wirelessly, between the apparatus 1300 and other devices. The apparatus 1300 can access a wireless network based on a communication standard, such as WiFi, 2G, or 3G, or a combination thereof. In one example, the communication component 1316 receives a broadcast signal or broadcast associated information from an external broadcast management system via a broadcast channel. In one example, the communication component 1316 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In example of the present disclosure, the apparatus 1300 may be implemented with one or more application specific integrated circuits (ASICs), digital signal processors (DSPs), digital signal processing devices (DSPDs), programmable logic devices (PLDs), field programmable gate arrays (FPGAs), remote control devices, micro remote control devices, microprocessors, or other electronic components, to perform the above method.

In examples, there is also provided a non-transitory computer-readable storage medium including instructions, such as included in the memory 1304, executable by the processor 1320 in the apparatus 1300 to perform the above method. For example, the non-transitory computer-readable storage medium may be a ROM, a random access memory (RAM), a CD-ROM, a magnetic tape, a floppy disc, an optical data storage apparatus, and the like.

A non-transitory computer-readable storage medium, wherein when instructions in the storage medium are executed by a processor of an electronic device, the electronic device is able to execute a method for determining a charging time length of a battery, the method including:

acquiring a current charging state type of the battery after it is monitored that the battery of the electronic device enters a charging state;

determining a charging stage of the battery, wherein the charging stage includes a constant current charging stage and a constant voltage charging stage;

determining the charging time length required by the battery according to the charging state type and the charging stage.

According to a first aspect of the present disclosure, there is provided a method for determining a charging time length of a battery, applied to an electronic device, including: acquiring, by an electronic device, a charging state type of the battery, in response to detecting that the battery of the electronic device enters a charging state; determining, by the electronic device, a charging stage of the battery, wherein the charging stage comprises a constant current charging stage and a constant voltage charging stage; and determining the charging time length required by the battery according to the charging state type and the charging stage.

In the example, the charging state type includes an off-screen charging state or a bright-screen charging state.

In the example, the determining the charging time length required by the battery according to the charging state type and the charging stage includes:

acquiring a first existing electric quantity of the battery in a current stage and a first charging current in the constant current charging stage under the off-screen charging state, when the charging state type is the off-screen charging state and the charging stage is the constant current charging stage;

acquiring a first maximum electric quantity in the constant current charging stage under the off-screen charging state;

determining a first charging time length of the constant current charging stage under the off-screen charging state according to the first existing electric quantity, the first charging current and the first maximum electric quantity;

determining a second charging time length of the constant voltage charging stage under the off-screen charging state according to the first maximum electric quantity, a maximum electric quantity of the battery, and a terminal voltage when the battery is fully charged;

determining a sum of the first charging time length and the second charging time length as the charging time length required by the battery.

In the example, the acquiring a first maximum electric quantity in the constant current charging stage under the off-screen charging state includes:

determining a first to-be-loaded impedance of the battery in the constant current charging stage under the off-screen charging state;

determining the first maximum electric quantity in the constant current charging stage under the off-screen charging state, according to the first to-be-loaded impedance, the terminal voltage when the battery is fully charged and the first charging current.

In the example, the determining a second charging time length of the constant voltage charging stage under the off-screen charging state according to the first maximum electric quantity, a maximum electric quantity of the battery, and a terminal voltage when the battery is fully charged includes:

determining the second charging time length of the constant voltage charging stage under the off-screen charging state according to the following formula:

$$T_2 = \int_{Q_2}^{Q_{max}} \frac{\sum_{n=1}^{6} B_n Q^{6-n}}{V_{max} - \sum_{n=1}^{6} A_n Q^{6-n}} * dQ$$

where, $T_2$ is the second charging time length, $A_n$ and $B_n$ are parameters describing battery material properties, $Q_2$ is the first maximum electric quantity, and $Q_{max}$ is the maximum electric quantity of the battery.

In the example, the determining the charging time length required by the battery according to the charging state type and the charging stage includes:

acquiring a second existing electric quantity of the battery in a current stage when the charging state type is the off-screen charging state and the charging stage is the constant voltage charging stage;

determining the charging time length required by the battery according to the second existing electric quantity, a maximum electric quantity of the battery, and a terminal voltage when the battery is fully charged.

In the example, the determining the charging time length according to the second existing electric quantity, a maximum electric quantity of the battery, and a terminal voltage when the battery is fully charged includes:

determining the charging time length according to the following formula:

$$T = \int_{Q_3}^{Q_{max}} \frac{\sum_{n=1}^{6} B_n Q^{6-n}}{V_{max} - \sum_{n=1}^{6} A_n Q^{6-n}} * dQ$$

where, T is the charging time length, $A_n$ and $B_n$ are parameters describing battery material properties, $Q_3$ is the second existing electric quantity, and $Q_{max}$ is the maximum electric quantity of the battery.

In the example, the determining the charging time length required by the battery according to the charging state type and the charging stage includes:

acquiring a third existing electric quantity of the battery in a current stage and a third charging current in the constant current charging stage under the bright-screen charging state, when the charging state type is the bright-screen charging state and the charging stage is the constant current charging stage;

acquiring a third maximum electric quantity in the constant current charging stage under the bright-screen charging state;

determining a third charging time length according to the third existing electric quantity, the third charging current and the third maximum electric quantity;

determining a time length for reaching a highest temperature under the third charging current;

determining a fourth charging time length of the constant current charging stage under the bright-screen charging state according to the time length for reaching the highest temperature and the third charging time length;

determining a fifth charging time length of the constant voltage charging stage under the bright-screen charging state according to the third maximum electric quantity, a maximum electric quantity of the battery, and a terminal voltage when the battery is fully charged;

determining a sum of the fourth charging time length and the fifth charging time length as the charging time length required by the battery.

In the example, the determining a fourth charging time length of the constant current charging stage under the bright-screen charging state according to the time length for reaching the highest temperature and the third charging time length includes:

determining an electric quantity of the battery when the highest temperature is reached according to the third existing electric quantity and the time length for reaching the highest temperature, when the time length for reaching the highest temperature is less than the third charging time length;

acquiring a charging current after current adjustment and a third to-be-loaded impedance;

determining the maximum electric quantity after the current adjustment according to the charging current after the current adjustment and the third to-be-loaded impedance;

determining a sixth charging time length according to the maximum electric quantity after the current adjustment, the electric quantity when the highest temperature is reached, and the charging current after the current adjustment;

determining a sum of the time length for reaching the highest temperature and the sixth charging time length as the fourth charging time length.

In the example, the determining a fourth charging time length of the constant current charging stage under the bright-screen charging state according to the time length for reaching the highest temperature and the third charging time length includes:

determining the third charging time length as the fourth charging time length, when the time length for reaching the highest temperature is greater than the third charging time length.

In the example, the determining a time length for reaching a highest temperature under the third charging current includes:

determining a temperature rise speed of the constant current charging stage under the bright-screen charging state;

determining the time length for reaching the highest temperature under the third charging current according to the temperature rise speed.

In the example, the determining a temperature rise speed of the constant current charging stage under the bright-screen charging state includes:

acquiring temperature difference within N units of time;

determining an average value of the temperature difference within the N units of time as the temperature rise speed.

In the example, the determining the charging time length required by the battery according to the charging state type and the charging stage includes:

acquiring a fourth existing electric quantity of the battery in a current stage, when the charging state type is the bright-screen charging state and the charging stage is the constant voltage charging stage;

determining a charging time length required by the battery according to the fourth existing electric quantity, the maximum electric quantity of the battery, and a terminal voltage when the battery is fully charged.

According to a second aspect of the present disclosure, there is provided an apparatus for determining a charging time length of a battery, including: an acquiring module, configured to acquire a current charging state type of the battery after it is monitored that the battery of the electronic device enters a charging state;

a first determining module, configured to determine a charging stage of the battery, wherein the charging stage includes a constant current charging stage and a constant voltage charging stage;

a second determining module, configured to determine the charging time length required by the battery according to the charging state type and the charging stage.

According to a third aspect of the present disclosure, there is provided an apparatus for determining a charging time length of a battery, including:

a processor;

a memory for storing instructions executable by the processor, wherein the processor is configured to:

acquire a current charging state type of the battery after it is monitored that the battery of the electronic device enters a charging state;

determine a charging stage of the battery, wherein the charging stage includes a constant current charging stage and a constant voltage charging stage;

determine the charging time length required by the battery according to the charging state type and the charging stage.

According to a fourth aspect of the present disclosure, there is provided a non-transitory computer-readable storage medium, wherein when instructions in the storage medium are executed by a processor of an electronic device, the electronic device is able to execute a method for determining a charging time length of a battery, the method including:

acquiring a current charging state type of the battery after it is monitored that the battery of the electronic device enters a charging state;

determining a charging stage of the battery, wherein the charging stage includes a constant current charging stage and a constant voltage charging stage;

determining the charging time length required by the battery according to the charging state type and the charging stage.

The technical solutions provided by the examples of the present disclosure may include following beneficial effects: the method for determining the charging time length of the battery provided by the present disclosure can determine the charging time length required by the battery in real time according to the charging state type and the charging stage of the battery. By distinguishing different charging scenarios, a more accurate charging time can be estimated, and the user experience is improved.

Other examples of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. A method for determining a charging time length of a battery, comprising:

acquiring, by an electronic device, a charging state type of the battery, in response to detecting that the battery of the electronic device enters a charging state;

determining, by the electronic device, a charging stage of the battery, wherein the charging stage comprises a constant current charging stage and a constant voltage charging stage; and determining the charging time length required by the battery according to the charging state type and the charging stage.

2. The method for determining the charging time length of the battery according to claim 1, wherein the charging state type comprises an off-screen charging state or a bright-screen charging state.

3. The method for determining the charging time length of the battery according to claim 2, wherein determining the charging time length required by the battery according to the charging state type and the charging stage comprises:

acquiring a first existing electric quantity of the battery in a current stage and a first charging current in the constant current charging stage under the off-screen charging state, when the charging state type is the off-screen charging state and the charging stage is the constant current charging stage;

acquiring a first maximum electric quantity in the constant current charging stage under the off-screen charging state;

determining a first charging time length of the constant current charging stage under the off-screen charging state according to the first existing electric quantity, the first charging current and the first maximum electric quantity;

determining a second charging time length of the constant voltage charging stage under the off-screen charging state according to the first maximum electric quantity, a maximum electric quantity of the battery, and a terminal voltage when the battery is fully charged; and determining a sum of the first charging time length and the second charging time length as the charging time length required by the battery.

4. The method for determining the charging time length of the battery according to claim 3, wherein acquiring the first maximum electric quantity in the constant current charging stage under the off-screen charging state comprises:

determining a first to-be-loaded impedance of the battery in the constant current charging stage under the off-screen charging state; and determining the first maximum electric quantity in the constant current charging stage under the off-screen charging state, according to the first to-be-loaded impedance, the terminal voltage when the battery is fully charged and the first charging current.

5. The method for determining the charging time length of the battery according to claim 3, wherein determining the second charging time length of the constant voltage charging stage under the off-screen charging state according to the first maximum electric quantity, the maximum electric quantity of the battery, and the terminal voltage when the battery is fully charged comprises:

determining the second charging time length of the constant voltage charging stage under the off-screen charging state according to:

$$T_2 = \int_{Q_2}^{Q_{max}} \frac{\sum_{n=1}^{6} B_n Q^{6-n}}{V_{max} - \sum_{n=1}^{6} A_n Q^{6-n}} * dQ$$

where, $T_2$ is the second charging time length, $A_n$ and $B_n$ are parameters describing battery material properties, $Q_2$ is the first maximum electric quantity, and $Q_{max}$ is the maximum electric quantity of the battery.

6. The method for determining the charging time length of the battery according to claim 2, wherein determining the charging time length required by the battery according to the charging state type and the charging stage comprises:

acquiring a second existing electric quantity of the battery in a current stage when the charging state type is the off-screen charging state and the charging stage is the constant voltage charging stage; and determining the charging time length required by the battery according to the second existing electric quantity, a maximum electric quantity of the battery, and a terminal voltage when the battery is fully charged.

7. The method for determining the charging time length of the battery according to claim 6, wherein determining the charging time length according to the second existing electric quantity, the maximum electric quantity of the battery, and the terminal voltage when the battery is fully charged comprises:

determining the charging time length according to:

$$T = \int_{Q_3}^{Q_{max}} \frac{\sum_{n=1}^{6} B_n Q^{6-n}}{V_{max} - \sum_{n=1}^{6} A_n Q^{6-n}} * dQ$$

where, T is the charging time length, $A_n$ and $B_n$ are parameters describing battery material properties, $Q_3$ is the second existing electric quantity, and $Q_{max}$ is the maximum electric quantity of the battery.

8. The method for determining the charging time length of the battery according to claim 2, wherein determining the charging time length required by the battery according to the charging state type and the charging stage comprises:

acquiring a third existing electric quantity of the battery in a current stage and a third charging current in the constant current charging stage under the bright-screen charging state, when the charging state type is the bright-screen charging state and the charging stage is the constant current charging stage;

acquiring a third maximum electric quantity in the constant current charging stage under the bright-screen charging state;

determining a third charging time length according to the third existing electric quantity, the third charging current and the third maximum electric quantity;

determining a time length for reaching a highest temperature under the third charging current;

determining a fourth charging time length of the constant current charging stage under the bright-screen charging state according to the time length for reaching the highest temperature and the third charging time length;

determining a fifth charging time length of the constant voltage charging stage under the bright-screen charging state according to the third maximum electric quantity, a maximum electric quantity of the battery, and a terminal voltage when the battery is fully charged; and determining a sum of the fourth charging time length and the fifth charging time length as the charging time length required by the battery.

9. The method for determining the charging time length of the battery according to claim 8, wherein determining the fourth charging time length of the constant current charging stage under the bright-screen charging state according to the time length for reaching the highest temperature and the third charging time length comprises:

determining an electric quantity of the battery when the highest temperature is reached according to the third existing electric quantity and the time length for reaching the highest temperature, when the time length for reaching the highest temperature is less than the third charging time length;

acquiring a charging current after current adjustment and a third to-be-loaded impedance;

determining the maximum electric quantity after the current adjustment according to the charging current after the current adjustment and the third to-be-loaded impedance;

determining a sixth charging time length according to the maximum electric quantity after the current adjustment, the electric quantity when the highest temperature is reached, and the charging current after the current adjustment; and determining a sum of the time length for reaching the highest temperature and the sixth charging time length as the fourth charging time length.

10. The method for determining the charging time length of the battery according to claim 8, wherein determining the fourth charging time length of the constant current charging stage under the bright-screen charging state according to the time length for reaching the highest temperature and the third charging time length comprises:

determining the third charging time length as the fourth charging time length, when the time length for reaching the highest temperature is greater than the third charging time length.

11. The method for determining the charging time length of the battery according to claim 8, wherein determining the time length for reaching the highest temperature under the third charging current comprises:
   determining a temperature rise speed of the constant current charging stage under the bright-screen charging state; and
   determining the time length for reaching the highest temperature under the third charging current according to the temperature rise speed.

12. The method for determining the charging time length of the battery according to claim 11, wherein determining the temperature rise speed of the constant current charging stage under the bright-screen charging state comprises:
   acquiring temperature difference within N units of time; and
   determining an average value of the temperature difference within the N units of time as the temperature rise speed.

13. The method for determining the charging time length of the battery according to claim 2, wherein determining the charging time length required by the battery according to the charging state type and the charging stage comprises:
   acquiring a fourth existing electric quantity of the battery in a current stage, when the charging state type is the bright-screen charging state and the charging stage is the constant voltage charging stage; and
   determining a charging time length required by the battery according to the fourth existing electric quantity, the maximum electric quantity of the battery, and a terminal voltage when the battery is fully charged.

14. An apparatus for determining a charging time length of a battery, comprising:
   a processor;
   a memory for storing instructions executable by the processor,
   wherein the processor is configured to:
   acquire a current charging state type of the battery, in response to detecting that the battery of the electronic device enters a charging state;
   determine a charging stage of the battery, wherein the charging stage comprises a constant current charging stage and a constant voltage charging stage; and
   determine the charging time length required by the battery according to the charging state type and the charging stage.

15. A non-transitory computer-readable storage medium, wherein when instructions in the storage medium are executed by a processor of an electronic device, the electronic device is able to execute a method for determining a charging time length of a battery, the method comprising:
   acquiring a current charging state type of the battery, in response to detecting that the battery of the electronic device enters a charging state;
   determining a charging stage of the battery, wherein the charging stage comprises a constant current charging stage and a constant voltage charging stage; and
   determining the charging time length required by the battery according to the charging state type and the charging stage.

* * * * *